(12) United States Patent
Ziaja et al.

(10) Patent No.: US 11,449,404 B1
(45) Date of Patent: Sep. 20, 2022

(54) BUILT-IN SELF-TEST FOR PROCESSOR UNIT WITH COMBINED MEMORY AND LOGIC

(71) Applicant: SambaNova Systems, Inc., Palo Alto, CA (US)

(72) Inventors: Thomas Alan Ziaja, Austin, TX (US); Dinesh Rajasavari Amirtharaj, Milpitas, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 17/501,969

(22) Filed: Oct. 14, 2021

Related U.S. Application Data

(60) Provisional application No. 63/220,266, filed on Jul. 9, 2021.

(51) Int. Cl.
*G06F 11/27* (2006.01)
*G06F 11/22* (2006.01)

(52) U.S. Cl.
CPC .......... *G06F 11/27* (2013.01); *G06F 11/2236* (2013.01)

(58) Field of Classification Search
CPC .............................. G06F 11/27; G06F 11/2236
See application file for complete search history.

(56) References Cited

U.S. PATENT DOCUMENTS

| | | | |
|---|---|---|---|
| 3,761,695 A | 9/1973 | Eichelberger | |
| 4,929,889 A * | 5/1990 | Seiler | G01R 31/318558 714/E11.169 |
| 5,369,752 A | 11/1994 | Giles et al. | |
| 5,978,946 A * | 11/1999 | Needham | G06F 11/2236 714/E11.166 |
| 6,249,892 B1 * | 6/2001 | Rajsuman | G06F 11/2236 714/739 |
| 6,249,893 B1 * | 6/2001 | Rajsuman | G06F 11/2236 714/739 |

(Continued)

FOREIGN PATENT DOCUMENTS

WO 2010142987 A1 12/2010

OTHER PUBLICATIONS

Prabhakar et al., "Plasticine: A Reconfigurable Architecture for Parallel Patterns", ISCA '17, Jun. 24-24, 2017, Toronto ON, Canada.

(Continued)

*Primary Examiner* — Matthew M Kim
*Assistant Examiner* — Indranil Chowdhury
(74) *Attorney, Agent, or Firm* — Haynes Beffel & Wolfeld LLP; Sikander M. Khan; André Henri Grouwstra

(57) ABSTRACT

A processor unit includes a memory and an ALU coupled with the memory. The processor unit also comprises a test controller, a test control register, and a signature register. The test controller manages a series of steps to test the processor unit. It overrides an ALU control signal with a replacement ALU control signal, stored in the test control register. It generates a test pattern and writes it to a memory address. It reads memory output data from the memory address, and forwards it to the ALU. The ALU executes an operation on the memory output data based on the replacement ALU control signal. The ALU output provides a test result, which is compressed to obtain a test signature, and stored in the signature register.

22 Claims, 8 Drawing Sheets

(56) References Cited

U.S. PATENT DOCUMENTS

| | | | |
|---|---|---|---|
| 6,317,819 B1* | 11/2001 | Morton | G06F 9/3012 |
| | | | 711/E12.051 |
| 6,532,337 B1 | 3/2003 | Yoshinaka | |
| 8,214,172 B2 | 7/2012 | Wang et al. | |
| 8,924,801 B2 | 12/2014 | Tekumalla et al. | |
| 9,739,833 B2 | 8/2017 | Hou et al. | |
| 10,831,507 B2 | 11/2020 | Shah et al. | |
| 2002/0083388 A1* | 6/2002 | Lueck | G01R 31/318547 |
| | | | 714/726 |
| 2004/0123198 A1 | 6/2004 | Gschwind | |
| 2004/0218454 A1 | 11/2004 | Gorman et al. | |
| 2005/0268185 A1 | 12/2005 | Vinke et al. | |
| 2011/0239070 A1* | 9/2011 | Morrison | G06F 11/2236 |
| | | | 714/E11.155 |
| 2013/0080847 A1 | 3/2013 | Zorian et al. | |
| 2014/0281776 A1 | 9/2014 | Champion et al. | |
| 2014/0317463 A1 | 10/2014 | Chandra et al. | |
| 2015/0206559 A1 | 7/2015 | Priel et al. | |
| 2015/0276874 A1 | 10/2015 | Morton | |
| 2015/0325314 A1* | 11/2015 | Ziaja | G11C 7/1078 |
| | | | 365/189.12 |
| 2018/0238965 A1 | 8/2018 | Anzou et al. | |
| 2019/0204382 A1 | 7/2019 | Pradeep et al. | |
| 2020/0258590 A1* | 8/2020 | Spica | G01R 31/318597 |
| 2020/0310809 A1 | 10/2020 | Hughes et al. | |
| 2022/0092247 A1* | 3/2022 | Koeplinger | G06F 8/443 |

OTHER PUBLICATIONS

Seok, et al., "Write-through method for embedded memory with compression Scan-based testing," 2012 IEEE 30th VLSI Test Symposium (VTS), Apr. 23-26, 2012, pp. 158-163.

Sitchinava, Thesis: "Dynamic Scan Chains A Novel Architecture to Lower the Cost of VLSI Test," MIT, Sep. 2003, 64 pages.

Podobas et al, A Survey on Coarse-Grained Reconfigurable Architectures From a Performance Perspective, IEEEAccess, vol. 2020. 3012084, Jul. 27, 2020, 25 pages.

M. Emani et al., "Accelerating Scientific Applications With SambaNova Reconfigurable Dataflow Architecture," in Computing in Science & Engineering, vol. 23, No. 2, pp. 114-119, Mar. 1-Apr. 2021, doi: 10.1109/MCSE.2021.3057203.

Garg et. al., LBIST—A technique for infield safety, Design&Reuse, dated Sep. 21, 2015, 4 pages.

Radhakrishnan, Design for Testability (DFT) Using SCAN, dated Sep. 1999, Issue-2, 13 pages.

Press, Thorough test means testing through the RAM, EDN, dated Sep. 17, 2012, 3 pages.

Li et. al., Logic BIST: State-of-the-Art and Open Problems, dated Mar. 16, 2015, 6 pages.

Venkataraman et. al., An experimental study of N-detect scan ATPG patterns on a processor, Proceedings of the 22nd IEEE VLSI Test Symposium (VTS 2004), dated May 2004, 7 pages.

Krishna H. V. et.al., Techniques to Improve Quality of Memory Interface Tests in SoCs Using Synopsys TetraMAX's RAM Sequential ATPG, Texas Instruments, Bangalore, India, 14 pages. Retrieved on Oct. 20, 2021. Retrieved from the internet [URL: https://pdfcoffee.com/ram-sequential-atpg-pdf-free.html ].

MacDonald, Logic BIST, EE5375 University of Texas El Paso (UTEP), dated Nov. 20, 2014, 15 pages.

Einfochips PES, Memory Testing: MBIST, BIRA & BISR | An Insight into Algorithms and Self Repair Mechanism, Einfochips, dated Dec. 11, 2019, 14 pages. Retrieved on Oct. 21, 2021. Retrieved from the internet [URL: https://www.einfochips.com/blog/memory-testing-an-insight-into-algorithms-and-self-repair-mechanism/#utm_source=rss&utm_medium=rss ].

U.S. Appl. No. 17/503,227—Office Action dated Feb. 4, 2022, 11 pages.

U.S. Appl. No. 17/468,066—Office Action dated Jan. 18, 2022, 46 pages.

U.S. Appl. No. 17/503,227 Notice of Allowance dated Apr. 4, 2022, 9 pages.

U.S. Appl. No. 17/468,024—Office Action dated Jan. 18, 2022, 47 pages.

U.S. Appl. No. 17/468,024—Response to Office Action dated Jan. 18, 2022, filed Apr. 7, 2022, 11 pages.

U.S. Appl. No. 17/468,066—Response to Office Action dated Jan. 18, 2022, filed Apr. 7, 2022, 11 pages.

PCT/US2021/057391—International Search Report and Written Opinion, dated Feb. 24, 2022, 14 pages.

U.S. Appl. No. 17/503,227—Response to Office Action dated Feb. 4, 2022, filed Mar. 17, 2022, 9 pages.

* cited by examiner

BUILT-IN SELF-TEST FOR PROCESSOR UNIT WITH COMBINED MEMORY AND LOGIC

CROSS-REFERENCES

This application claims the benefit of U.S. provisional patent application No. 63/220,266, entitled, "Logic BIST and Functional Test for a CGRA," filed on 9 Jul. 2021. The priority application is hereby incorporated by reference herein for all purposes.

This application is related to U.S. application entitled "Array of Processor Units with Pathway BIST", Ser. No. 17/503,227 filed concurrently herewith, which is hereby incorporated by reference herein for all purposes.

The following are also incorporated by reference for all purposes as if fully set forth herein:

Prabhakar et al., "Plasticine: A Reconfigurable Architecture for Parallel Patterns," ISCA '17, Jun. 24-28, 2017, Toronto, ON, Canada; and Shah et al., "Configuration Load of a Reconfigurable Data Processor", U.S. Pat. No. 10,831,507, issued Nov. 10, 2020.

BACKGROUND

Technical Field

The technology disclosed relates to built-in self-test (BIST) of integrated circuits. In particular, it relates to testing of processor chips that include one or more modules comprising a datapath with a memory and an ALU.

Context

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

Integrated circuits that combine multiple processors on a single die, such as used for artificial intelligence or graphics processing, are made in the most advanced semiconductor processes. Such processes always provide new challenges to IC designers, including for testing their correct functionality prior to shipping finished product to customers. Traditionally, a digital IC is tested using automatic test pattern generation (ATPG), which distributes the ATPG test vectors over the IC in scan chains that transport the test vectors from an external tester to scan flipflops in the logic, and that transport test results back from the scan flipflops to the external test machine. Test vectors and test results may be compressed for more efficient interfacing. Tests focus on detecting stuck-at faults, and a coverage (i.e., reachability and observability) percentage in the high nineties has been considered adequate. Additionally, an integrated circuit may include circuits for built-in self-test (BIST) dedicated to specific blocks. Those includes memories (memory BIST, or MBIST), other standardized circuits, and some logic (logic BIST, or LBIST). BIST significantly reduces the dependence on an external tester and the cost of testing the IC, which is proportional to the time a tester takes for testing the IC. It can also be used after production, so that an IC in a life-critical application can test itself every time it is powered up.

Logic BIST generates and applies a relatively large number of pseudo-random test vectors to the scan chains, compresses the results obtained at-speed, and compares the compressed results with precompiled compressed results to detect any differences (i.e., errors). However, LBIST has challenges. The pseudo-random test vectors can create paths that are not used in normal operation (false paths), and may detect failures on the false paths. This wastes good ICs. LBIST may also generate extra heat because of heightened activity during test that would not be experienced in normal operation. The extra heat can cause timing violations, and thus functional faults. The heightened activity may also cause crosstalk issues that are not experienced during normal operation. Yet another problem is that LBIST cannot control don't-care bits. Whereas typically with ATPG the test coverage grows roughly linearly with the number of test vectors (until it nears an asymptote), for LBIST the test coverage grows only roughly logarithmically, and the asymptote may be lower than achieved with ATPG.

The fastest digital circuits cannot take the burden of slowdown by flipflops for scan testing with ATPG or LBIST vectors, and they may not be coverable with scan tests. For those cases, functional tests may be developed that directly test for the correct functionality of a circuit or block. Functional tests are used in moderation, as their development consumes much engineering time, and production test may take much tester time.

Processor chips are conventionally tested with ATPG for the logic and MBIST for the memory. The arithmetic logic unit (ALU) performs a number of different operations (on sets of two input numbers). The number of internal states the ALU can have can be exceedingly high, and ATPG scan testing has been considered the only practical solution to achieve good coverage.

However, the logic related to the insertion of MBIST vectors and the extraction of MBIST results creates problems for scan testing (ATPG or LBIST), including interface logic that is not observable, or shadow logic that isn't used in normal operation. Additionally, large processor chips made in advanced semiconductor processes show more failures than is expected on the basis of the scan test coverage for both stuck-at faults and speed-dependent mechanisms that should be found with at-speed tests. Defects that are the suspects for this discrepancy may include (1) bridging (short-circuits), (2) opens (missing connection), (3) defects in re-convergent logic for stuck-at vectors, (4) high-resistive shorts known as non-logic bridging, (5) resistive opens, and (6) coupling faults for at-speed vectors. One approach to capture these defects is functional testing, with the drawbacks mentioned above. Another, called "n-detect", is detecting a defect in n different ways as if it were a stuck-at fault. However, applying n-detect on ATPG increases the cost of testing by n times.

SUMMARY

In a first aspect, implementations of the disclosed technology provide a configurable unit that includes a memory, an ALU coupled with the memory, a test controller, a test control register, and a signature register. The signature register may be coupled with an ALU output to receive ALU output data, compress the ALU output data, and store the compressed result as a test signature. The test controller manages a series of steps. The steps include overriding an ALU control signal with a replacement ALU control signal (from the test control register). The test controller generates a test pattern and forwards the test pattern to an input of a first circuit, other than a scan chain input. The first circuit output data is forwarded to the ALU, which executes an ALU operation on the first circuit output data, based on the replacement ALU control signal. A test result is obtained from the ALU output, compressed, and stored in the signature register.

The first circuit may be (or include) the memory. The test controller forwards the test pattern to the memory and writes it a first address. It obtains first circuit output data by reading from the first address. The test pattern may be included in a series of test patterns for detecting a memory error. The test pattern may include a pseudo-random number, focused at testing logic in the datapath, including testing the ALU.

In a second aspect, implementations of the disclosed technology provide a method to test a datapath in a configurable unit. The datapath includes a memory and an ALU. The method includes the following steps. It provides a memory test vector from a series of memory test vectors to the memory, and writes the memory test vector to a first address in the memory. It reads memory output data from the first address, and forwards this data to the ALU. The method replaces a signal on an ALU control input with a replacement ALU control signal, and the ALU performs an operation on the data read from the memory, based on the replacement ALU control signal. A test result is obtained from the ALU data output, and compressed to obtain a test signature. The test signature is stored in a signature register.

Particular aspects of the technology disclosed are described in the claims, detailed description, and drawings.

Figure 1:
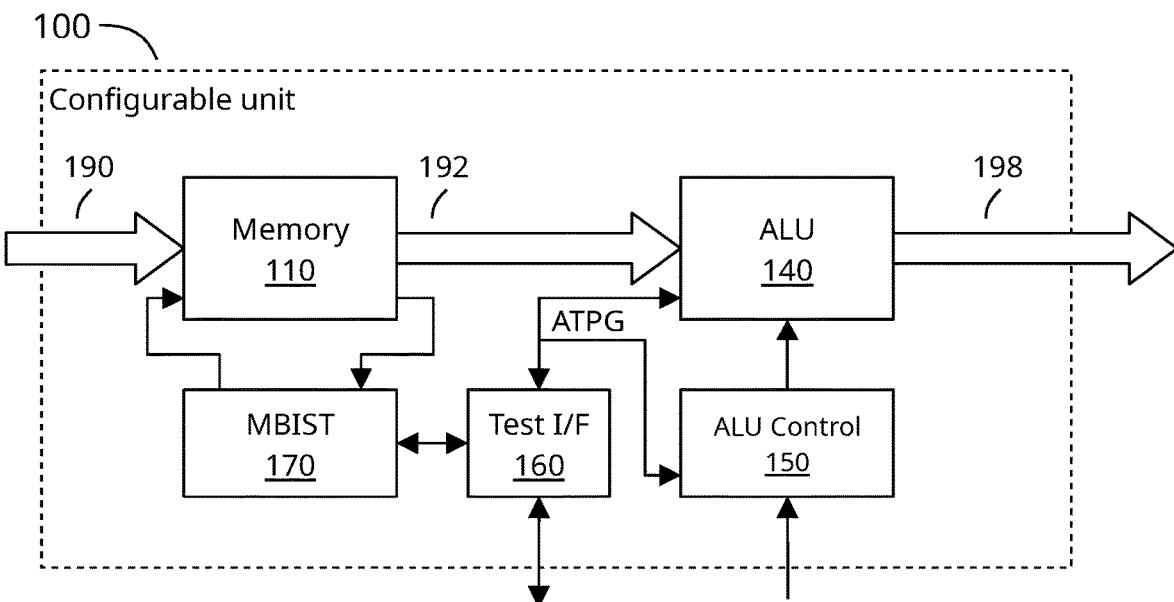
FIG. 1 illustrates a processor unit, such as used in a Coarse Grain Reconfigurable Architecture (CGRA) chip.

In the figures, like reference numbers may indicate functionally similar elements. The systems and methods illustrated in the figures, and described in the Detailed Description below, may be arranged and designed in a wide variety of different implementations. Neither the figures, nor the Detailed Description, are intended to limit the scope as claimed. Instead, they merely represent examples of different implementations of the disclosed technology.

DETAILED DESCRIPTION

Terminology

AGCU—Address generation and coalescing unit.
ALU—arithmetic logic unit.
ATPG—automatic test pattern generation.
BIST—built-in self-test.
CGRA—coarse-grained reconfigurable architecture.
CPU—central processing unit, a datapath along with a control unit.
Datapath—a collection of functional units that perform data processing operations, registers, and buses. The functional units may include memory, ALUs, multipliers, etc.
LFSR—a linear-feedback shift register.
MISR—Multiple-input signature register.
PCU—Pattern compute unit.
PMU—Pattern memory unit.
Processor—an electronic circuit that processes information (data and/or signals).
SIMD—Single instruction, multiple data.

Introduction

The datapath in a configurable unit in a CGRA may, for example, include logic circuits, a memory and an ALU. The ALU functionality may be configurable by an ALU control circuit responsive to a configuration file or bit file in a data flow architecture, or responsive to instructions in instruction cycles in a control flow architecture. The ALU may be or include one or more SIMDs for performing parallel operations. Multiple interconnected configurable units may make up a deep neural net, applicable for a wide spectrum of functions that are enhanced or made possible by artificial intelligence. Because of the large size of CGRA and other processor chips, modern processes are used, and conventional ways of production testing can no longer adequately and cost-effectively find nearly all functional defects. Memory BIST fails to adequately cover some relevant parts of the datapath. High-coverage scan tests still don't adequately find all defects. ATPG finds mostly stuck-at faults only, and n-detect ATPG scan tests are very expensive. Logic BIST has many challenges and can lead to false rejects.

Implementations of the disclosed technology provide a novel way of testing a configurable unit and other processor units. They equip the configurable unit with a test controller or BIST controller that tests the datapath from input to output, even if it is very wide, and that may provide both tests targeting the memory and tests targeting the ALU and other logic. Tests may be deterministic (for the memory) and/or pseudo-random (for the logic). The BIST controller ensures that the datapath is in a state that is similar to normal operation, so that logic testing becomes quasi-functional testing with generated, rather than designed, tests. It also controls compression of the output data to create a test signature that an external tester can compare with a precompiled signature. The use of generated tests provides the advantages of n-detect without the associated costs.

Implementations

The following detailed description is made with reference to the figures. Example implementations are described to illustrate the technology disclosed, not to limit its scope, which is defined by the claims. Those of ordinary skill in the art will recognize a variety of equivalent variations on the description that follows.

FIG. 1 illustrates a processor unit 100 such as used in a CGRA. Processor unit 100 may be configurable using configuration data like a bit file, and includes memory 110, ALU 140, and ALU control circuit 150, which controls the function of ALU 140. Data flows from input databus 190 through the blocks and intermediate databuses to output databus 198. Input databus 190 may carry address information and read/write control lines for memory 110, as well as data for memory 110. Input databus 190 may be very wide, and include multiple lanes of parallel data. The memory output data flows through intermediate bus 192 and enters ALU 140. ALU 140 may perform various sorts of operations on the data it receives from intermediate bus 192. The type of ALU operation is controlled by ALU control circuit 150.

Processor unit 100 further includes test interface 160 (for example, a JTAG port) which receives test instructions and test data, and returns test results. Test interface 160 controls MBIST controller 170, which can autonomously test the memory (and in many cases repair some defective locations), and it can send ATPG vectors into the scan chains, and return test results from the scan chains. This is an example of a processor unit including a test pattern generator, a circuit (MBIST controller 170) to apply a test vector from the test pattern generator to a data input of a datapath; and a test result output (test interface 160); configured to output a test result at the test result output. MBIST is a rather effective solution for testing memories, whereas ATPG is an efficient and low-power solution that readily achieves a relatively high coverage of stuck-at faults in logic circuits.

Figure 2:
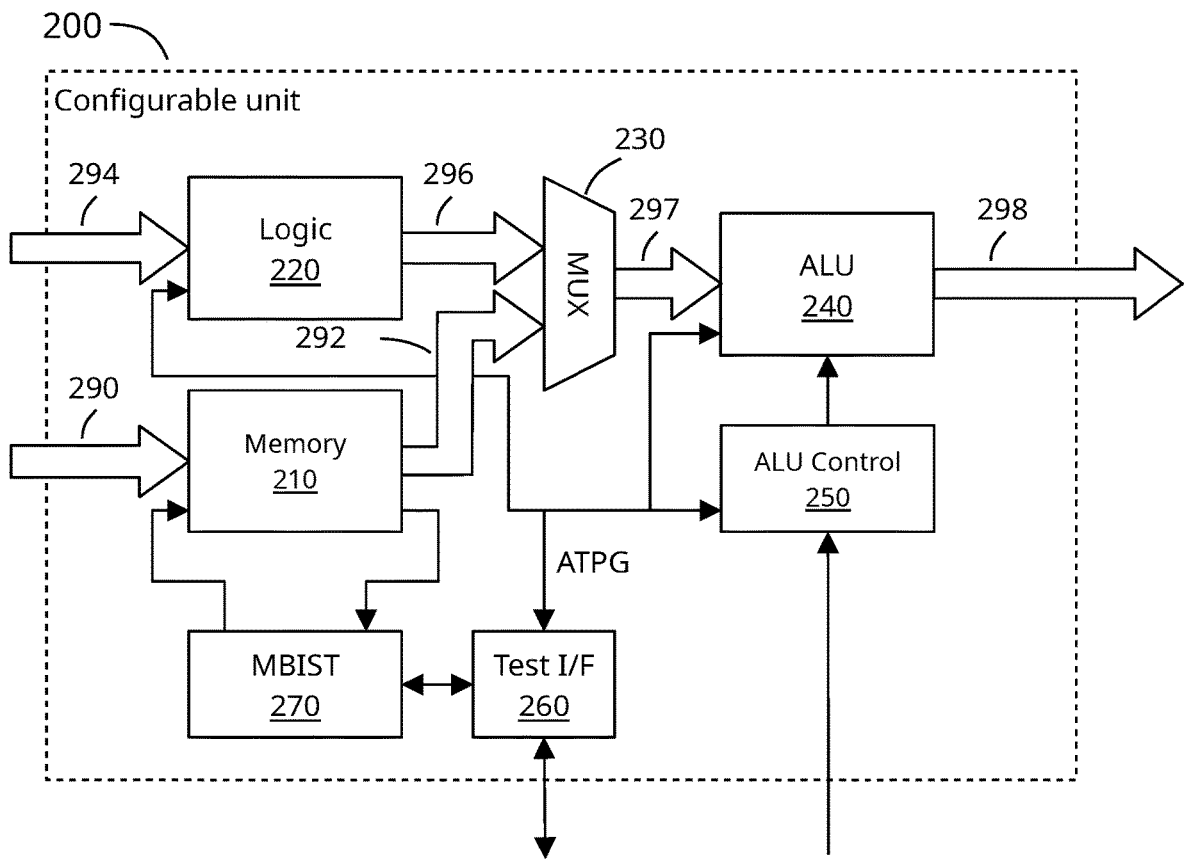
FIG. 2 illustrates a block diagram of another processor unit, such as might be used in a multiprocessor chip.

FIG. 2 illustrates a block diagram of another processor unit 200, such as might be used in a multiprocessor chip. In this architecture, there are two input paths, that may each have their own databus. Processor unit 200 may be configurable using configuration data like a bit file. It includes memory 210, logic circuit 220, multiplexer 230, ALU 240, and ALU control circuit 250. An input databus 290 may carry address information and read/write control lines for memory 210, as well as data for memory 210. Input databus 290 may be very wide, and include multiple lanes of parallel data. An input databus 294 may carry data for logic circuit 220. Logic circuit 220 may include combinational logic, flipflops, registers, and other elements. Memory 210 transfers its output data to multiplexer 230 via intermediate bus 292, and logic circuit 220 transfers its output data to multiplexer 230 via intermediate bus 296. Multiplexer 230 selects data from either intermediate bus 292 or intermediate bus 296 and transfers it to ALU 240 via intermediate bus 297. ALU 240 provides its output data on output databus 298.

Processor unit 200 further includes test interface 260 (for example, a JTAG port) and MBIST controller 270, which provide the same functionality as test interface 160 and MBIST controller 170 in FIG. 1. Whereas test interface 160 controlled the scan chains for ATPG vectors for ALU 140 and ALU control circuit 150, test interface 260 controls the scan chains for ATPG vectors for ALU 240, ALU control circuit 250, as well as logic circuit 220. This is an example of a processor unit including a test pattern generator; a circuit (MBIST controller 270) to apply a test vector from the test pattern generator to a data input of a datapath; and a test result output (M interface 260); configured to output a test result at the test result output. This test solution has worked well for both the basic datapath of FIG. 1 and the expanded datapath of FIG. 2. However, for the newest semiconductor process technologies and the very wide datapaths in current configurable unit designs, it misses many defects.

Figure 3:
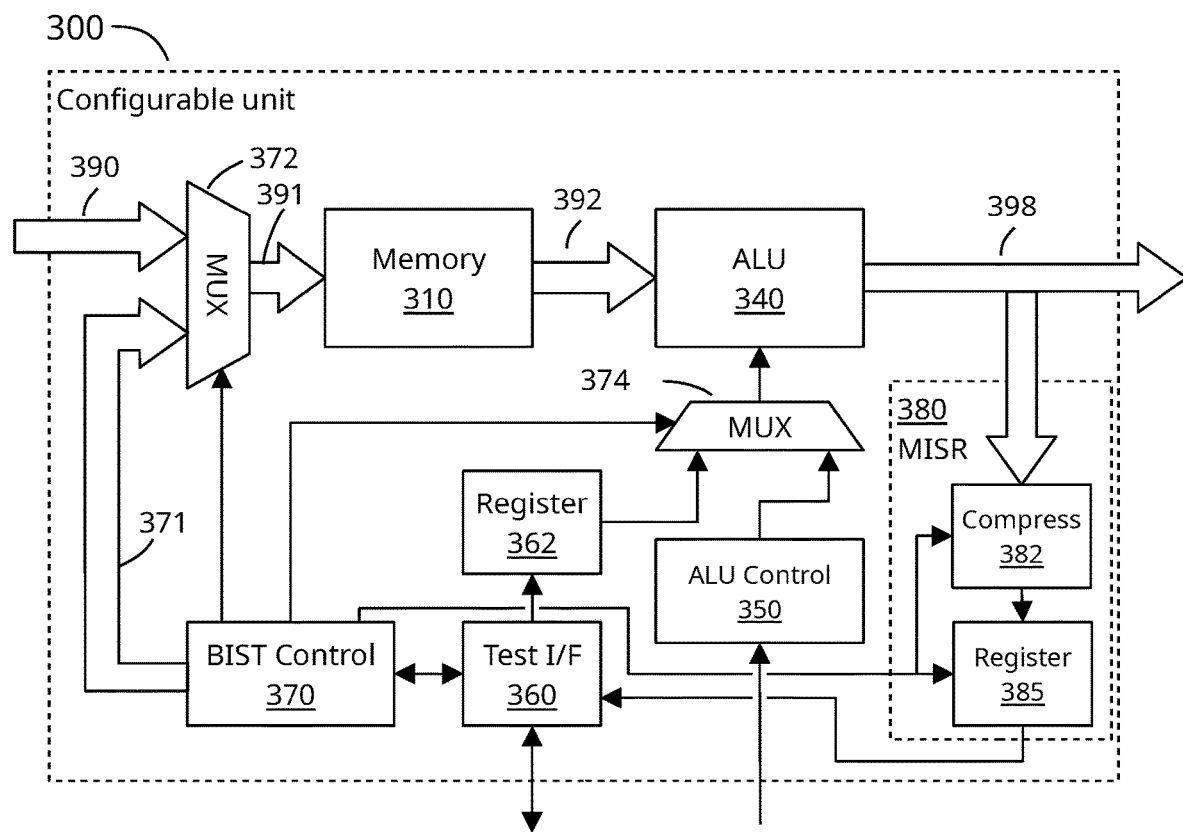
FIG. 3 illustrates another processor unit with built-in self test.

FIG. 3 illustrates another processor unit 300 with built-in self-test. FIG. 3 includes all elements of FIG. 1, with like numbering, such as memory 310, ALU 340, and ALU control circuit 350. The operation of ALU 340 can be determined by an ALU control signal generated in ALU control circuit 350, which can be statically configured in a data flow setting using configuration data from a bit file, or provided in each instruction cycle in a control flow setting by instruction decoding. Input databus 190 is illustrated in two parts, input databus 390 and intermediate bus 391, separated by multiplexer 372, and output databus 398. Processor unit 300 further includes test interface 360 (for example, a JTAG port), test control register 362, BIST controller 370, multiplexer 374, and MISR 380, which may include test result compressor 382 and signature register 385. This is an example of a processor unit including a test pattern generator, a circuit (BIST controller 370) to apply a test vector from the test pattern generator to a data input of a datapath, and a test result output (MISR 380), configured to output a test result at the test result output.

In normal operation, data flows through and is processed in processor unit 300 in the same manner as it flows through and is processed in processor unit 100 of FIG. 1. The BIST circuits may be inactive. An external tester may load test control register 362 with a replacement ALU control word, which it passes to an input of multiplexer 374 as a replacement ALU control signal. In BIST mode, controlled by BIST controller 370, multiplexer 372 replaces input data from input databus 390 with test vectors generated by BIST controller 370. The test vectors may include memory addresses and data to be stored in memory 310, and may be accompanied by read and write control signals for memory 310. In BIST mode, the test patterns may include deterministic vectors targeted at memory testing, and pseudo-random data targeted at logic testing.

BIST controller 370 can be configured to test the whole datapath from the input of memory 310 through the output of ALU 340, using the techniques described herein. For example, BIST controller 370 may generate or output a series of memory tests (test patterns optimized for detecting a memory error-such as a march algorithm, RAM sequential, zero-one, checkerboard, butterfly, sliding diagonal, etc.), but unlike in standard MBIST it may not directly monitor the output of memory 310. It may also generate a series of pseudo-random test vectors, but unlike in LBIST, it doesn't provide the pseudo-random test vectors to scan chains into ALU 340 and ALU control circuit 350. Instead, it provides the pseudo-random test vectors via memory 310 to ALU 340, while controlling both the memory write and read addresses and the ALU functionality (e.g., by overriding the output from ALU control circuit 350 using multiplexer 374). Output databus 398 outputs the data from ALU 340, for example to another configurable unit, but it also transfers the data to MISR 380. Test result compressor 382 may use any compression technique known in the art to compress the ALU output data, including cyclic redundancy check, ones count, transition count, parity checking, syndrome checking, etc. BIST controller 370 sends a signal to MISR 380 to compress the ALU output data and store the compressed output data as a signature in signature register 385, from where it can be read via test interface 360 by, for example, an external tester, that may compare the signature with a precompiled test signature to determine a test result.

An implementation does not need to isolate memory 310 from other circuits to perform a test. It uses the memory in situ. In an implementation, BIST controller 370 may generate a first part of the test vectors for testing memory 310, and a second part for testing the logic. By not changing the topology, leaving the datapath intact, and applying test vectors at the input of processor unit 300, an implementation achieves a better coverage of the datapath, and is able to test it at speed. By using pseudo-randomly generated test vectors, the implementation is able to achieve a high n-detect value, and thus a superior coverage of defects beyond just stuck-at faults. By using signature compression, the bandwidth burden on the chip's test bus can remain in check.

In an example implementation, a datapath may include 16 parallel 32-bit lanes for a total width of 512 bits. Additional lines may carry control signals, addresses, parity information, etc. In a first cycle in a test loop, BIST controller 370, via BIST input bus 371 and multiplexer 372, provides each lane with an address and data for memory 310, and gives it a write instruction. Memory 310 stores the data at the 16 addresses. In a next cycle, BIST controller 370 provides each lane with a next address, and gives a read instruction. Memory 310 retrieves the data, and outputs 16 lanes of parallel data on intermediate bus 392, which transports the data to ALU 340. BIST controller 370 overrides the ALU control circuit 350 in multiplexer 374 and selects the replacement ALU control signal for ALU 340, which processes the data it receives from intermediate bus 392. ALU 340 may include a SIMD, and may thus be capable of processing the 16 parallel lanes of data simultaneously. It outputs the results on output databus 398, which allows MISR 380 to compress the results, and store the compressed results as a signature in signature register 385. An external tester may read the compressed results from the MISR and compare them with precompiled compressed results to determine if they match (pass) or are different (fail).

BIST controller 370 may run 4,096 loops of such tests. The example operation may run 5 loops of testing dedicated to memory 310, and 4,091 loops of testing dedicated to the logic and ALU.

In addition, the implementation may run ATPG tests via test interface 360 into scan chains (not drawn in FIG. 3) anywhere in the datapath, ALU control circuit 350, and any of the BIST circuits, including BIST controller 370, multiplexer 372, multiplexer 374, test control register 362, and MISR 380.

Some implementations may deviate from the architecture shown in FIG. 3. For example, test control register 362 may be embedded in BIST controller 370 or in ALU control circuit 350. The functionality of test control register 362 and multiplexer 374 (i.e., overriding control of the ALU by BIST controller 370) may be integrated in ALU control circuit 350, and instead of controlling multiplexer 374, BIST controller 370 may directly provide a control signal to ALU control circuit 350. Further, test result compressor 382 and signature register 385 may be combined in a single circuit. Although FIG. 3 shows a single test interface, an implementation may have multiple test interfaces to communicate with the various test circuits shown, and to communicate with scan chains.

Figure 4:
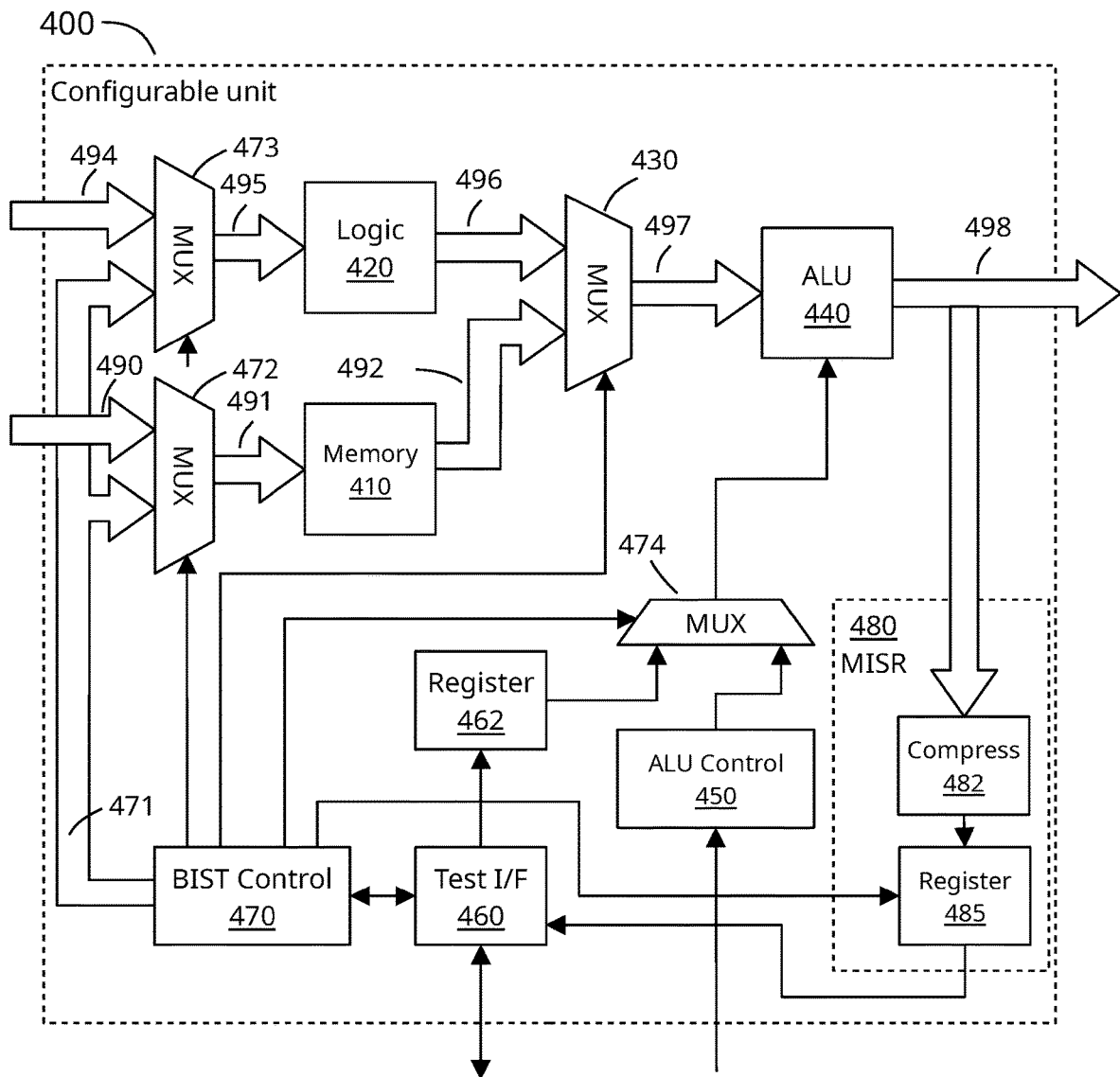
FIG. 4 illustrates another processor unit with BIST structures in an implementation of the disclosed technology.

FIG. 4 illustrates another processor unit 400 with BIST structures in an implementation of the disclosed technology. FIG. 4 includes all elements of FIG. 2, with like numbering. This includes memory 410, logic circuit 420, multiplexer 430, ALU 440, and ALU control circuit 450. However, input databus 290 has been split into two parts, input databus 490 and intermediate bus 491, separated by multiplexer 472 and input databus 294 has been split into input databus 494 and intermediate bus 495, separated by multiplexer 473. Both multiplexers are also coupled with BIST input bus 471, which receives its data from BIST controller 470. Processor unit 400 further includes test interface 460, test control register 462, multiplexer 474, and MISR 480, including test result compressor 482 and signature register 485. Further databuses are intermediate bus 492, intermediate bus 496, intermediate bus 497, and output databus 498. The operation of ALU 440 can be determined by an ALU control signal generated in ALU control circuit 450, which can be statically configured in a data flow setting using configuration data from a bit file, or provided in each instruction cycle in a control flow setting by instruction decoding.

In normal operation, data flows through and is processed in processor unit 400 in the same manner as it flows through and is processed in processor unit 200 of FIG. 2. The BIST circuits may be inactive. An external tester may load test control register 462 with a replacement ALU control word, which it passes to an input of multiplexer 474 as a replacement ALU control signal. In BIST mode, controlled by BIST controller 470, multiplexer 472 may replace input data from input databus 490 with test vectors generated by BIST controller 470. Also, multiplexer 473 may replace input data from input databus 494 with the test vectors. The test vectors for memory 410 may include memory addresses and data to be stored, along with read and write control signals, and patterns to test logic circuit 420. In BIST mode, the test patterns may include deterministic vectors targeted at memory testing, and pseudo-random data targeted at logic testing. BIST controller 470 also overrides control of the ALU 440, via multiplexer 474.

BIST controller 470 tests the whole datapath from the inputs of memory 410 and logic circuit 420 through the output of ALU 440, using the techniques described herein. For example, BIST controller 470 may generate or output a series of memory tests, but unlike in standard MBIST it doesn't directly monitor the output of memory 410. It may also generate a series of pseudo-random test vectors, but unlike in LBIST, it doesn't provide the pseudo-random test vectors to scan chains into logic circuit 420, ALU 440 and ALU control circuit 450. Instead, it provides the pseudo-random test vectors via memory 410 and/or logic circuit 420 to ALU 440, while controlling both the memory write and read addresses and the ALU functionality (e.g., by overriding the output from ALU control circuit 450 using multiplexer 474). Output databus 498 outputs the data from ALU 440, for example to another configurable unit, but it also transfers the data to MISR 480. Test result compressor 482 may use any compression technique known in the art to compress the data, including cyclic redundancy check, ones count, transition count, parity checking, syndrome checking, etc. BIST controller 470 sends a signal to MISR 480 to compress the ALU output data and store the compressed output data as a signature in signature register 485, from where it can be read via test interface 460 by, for example, an external tester, that may compare the signature with a precompiled test signature to determine a test result.

Testing the datapath via memory 410 may be similar or identical to the method described for testing processor unit 300 in FIG. 3. However, processor unit 400 has a secondary input path via input databus 494, intermediate bus 495, logic circuit 420, intermediate bus 496, and multiplexer 430. So, in addition to testing the datapath via memory 410, BIST controller 470 may select BIST input bus 471 at multiplexer 473 to pass test vectors through logic circuit 420.

To ensure testable behavior of ALU 440, an implementation may reset ALU 440 and any other part of the datapath in processor unit 400 at the start of testing, and BIST controller 470 may override the control signal from ALU control circuit 450 in multiplexer 474 to provide a replacement ALU control signal, or otherwise take control of the ALU 440 functionality. At the end of testing, BIST controller 470 may flush the datapath by running a series of zero vectors through it.

Some implementations may deviate from the architecture shown in FIG. 4. For example, test control register 462 may be embedded in BIST controller 470 or in ALU control circuit 450. The functionality of test control register 462 and multiplexer 474 (i.e., overriding control of the ALU by BIST controller 470) may be integrated in ALU control circuit 450, and instead of controlling multiplexer 474, BIST controller 470 may directly provide a control signal to ALU control circuit 450. Further, test result compressor 482 and signature register 485 may be combined in a single circuit. Although FIG. 4 shows a single test interface, an implementation may have multiple test interfaces to communicate with the various test circuits shown, and to communicate with scan chains.

Figure 5:
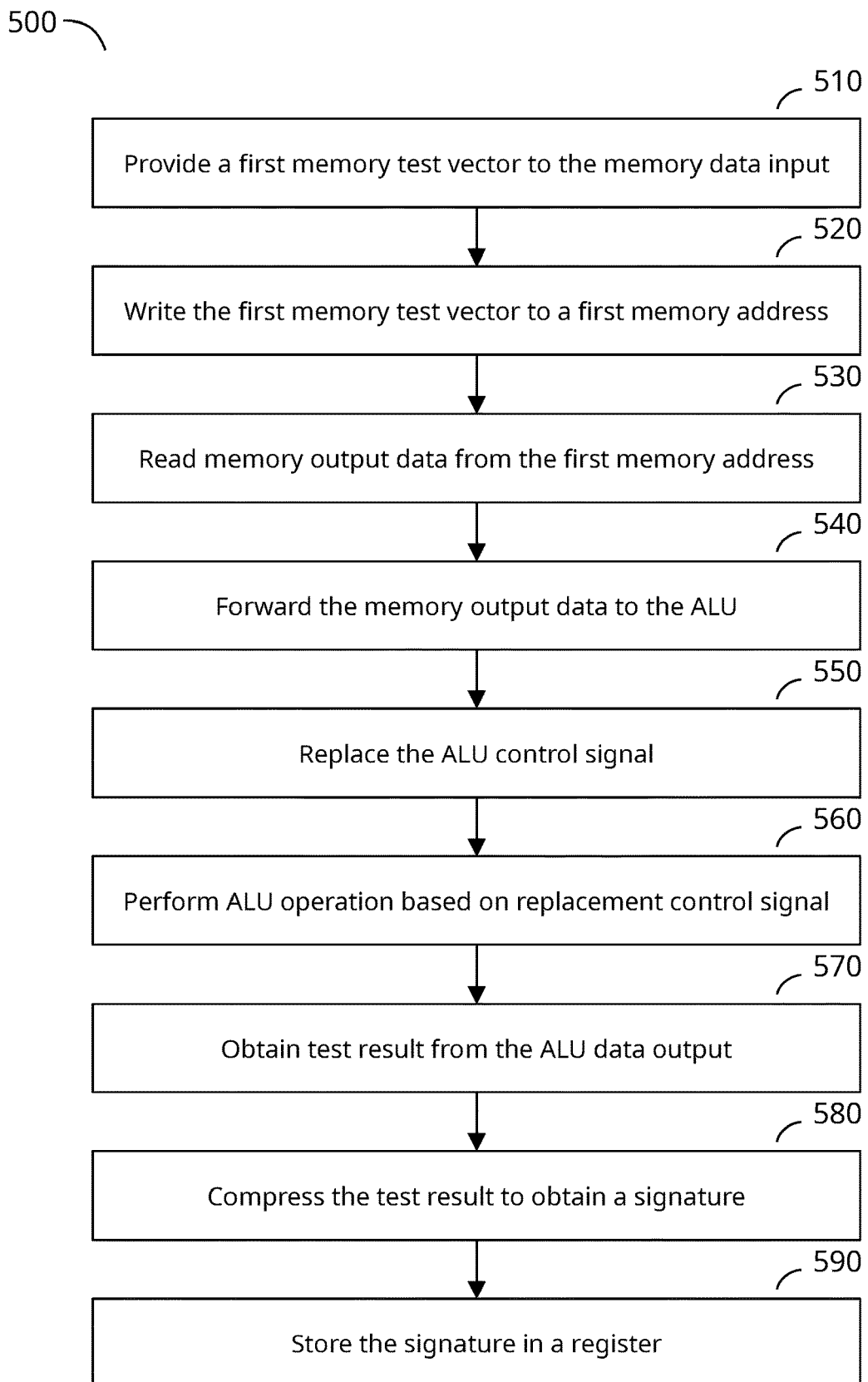
FIG. 5 illustrates a method for testing a datapath in a processor unit in an implementation of the disclosed technology.

FIG. 5 illustrates a method 500 for testing a datapath in a processor unit in an implementation of the disclosed technology. The datapath includes a memory with a data input and a data output, an ALU with a control input, a data input and a data output, and an intermediate bus coupling the memory data output with the ALU data input. Method 500 includes the following steps:

Step 510—providing a first memory test vector from a series of memory test vectors to the memory data input. The series of memory test vectors may follow any sequence of tests that uncover memory defects, including sequences determined in a march algorithm, RAM sequential, zero-one, checkerboard, butterfly, sliding diagonal, and other memory test algorithms.

Step 520—writing the first memory test vector to a first address in the memory. The first address may be determined by the memory test algorithm that the implementation follows.

Step 530—reading memory output data from the first address in the memory.

Step 540—forwarding the memory output data via the intermediate bus to the ALU.

Step 550—replacing a signal on the control input with a replacement ALU control signal. The replacement ALU control signal ensures that the ALU is testable in a manner that is at least representative for normal operation.

Step 560—performing an ALU operation based on the replacement ALU control signal. The ALU processes the data at its data input according to the replacement ALU control signal, and places the result on its data output as a test result.

Step 570—obtaining the test result from the ALU data output. An implementation may forward the test result to a MISR for Step 580 and Step 590.

Step 580—compressing the test result to obtain a signature. An implementation may use any compression technique known in the art to compress the ALU output data, including cyclic redundancy check, ones count, transition count, parity checking, syndrome checking, etc.

Step 590—storing the signature in a register. The register may be part of a MISR. Implementations may further compare the signature with a precompiled signature to determine a test result. For example, if the signature matches the precompiled signature, the test passes, and if they don't match, the test fails.

Method 500 may further include;

Step 511—providing a first pseudo-random number from a first series of pseudo-random numbers to the memory data input. An implementation may generate the first series of pseudo-random numbers using a first LFSR, with a first length, a first feedback polynomial, and a first seed.

Step 521—writing the first pseudo-random number to a second address in the memory. The second address may be any available address in the memory. The second address may be fixed, or it may be based on an index of the first pseudo-random number in the first series of pseudo-random numbers. For example, each pseudo-random number in the first series of pseudo-random numbers may have a unique index: a first pseudo-random number may have index 0, a second one may have index 1, a third one may have index 2, etc. The second address may increase or decrease with the index, or be any function of the index. In one implementation, the second address includes a one-hot encoded address based on (at least a part of bits included in) the index of the test pattern in the series of test patterns. A one-hot encoded number is a binary number with only a single bit "1", and all other bits "0". For example, index 0 may translate to a string of 16 bits 0000 0000 0000 0001; index 1 may translate to 0000 0000 0000 0010, etc. In an implementation where the second address includes a one-hot encoded version of the index, successive second addresses may address successive columns in the memory.

Step 531—reading memory output data from the second address in the memory. Method 500 may proceed with Step 540.

The datapath may further include a logic circuit with a data input and a data output, and a multiplexer with a first input coupled with the memory data output and a second input coupled with the logic circuit data output, and with an output coupled with the ALU data input. Method 500 may further include:

Step 512—providing a second pseudo-random number from a second series of pseudo-random numbers to the logic circuit data input. An implementation may generate the second series of pseudo-random numbers using a second LFSR, with a second length, a second feedback polynomial, and a second seed.

Step 542—forwarding data from the logic circuit data output via the multiplexer and the intermediate bus to the ALU. Method 500 may proceed with Step 550.

The technology disclosed relates to built-in self-test (BIST) of processor chips that include one or more processor units comprising a datapath with a memory and an ALU. The datapath may be very wide. Implementations use a new form of BIST that complements ATPG to support a high fault coverage. It circumvents the problems and limitations of ATPG, LBIST, and MBIST to separate functional and faulty ICs with high confidence.

Implementations may test a configurable unit with ATPG to achieve a high coverage of stuck-at faults, for example 99%. In addition, they may generate test patterns for memory test and functional test. They apply the test patterns to an input of the configurable unit, for instance a memory input or a logic input, and retrieve output data from an output of the configurable unit. Thus, the test patterns run through the full datapath to yield the output data. A BIST controller generates the test patterns, applies them to the configurable unit input, and ensures that the conditions of the datapath generally resemble those of normal operation. The BIST controller also instructs a MISR to compress the output data into a result signature, and store the result signature in a register. An external tester may access the register, for example via a JTAG test interface, to retrieve the result signature and compare it with a precompiled signature to determine the test result (pass if the result signature equals the precompiled signature, and fail otherwise).

The test patterns may include patterns specifically targeting the memory, and similar to those found in commercially available MBIST, including march tests and traditional tests such as zero-one, checkerboard, butterfly, sliding diagonal, etc. The test patterns may further include a series of pseudo-random numbers that target the ALU, and that are similar to those found in LBIST solutions. While an implementation checks the memory, the BIST controller or the external tester may place the ALU in a "transparent" mode, i.e. the output data equals the ALU input data, or the ALU could be kept in its standard operational mode. While the implementation checks the ALU and any other logic, the BIST controller controls memory addressing for transparent operation. The BIST controller may operate the memory at a fixed address, or it may sequence (in any order) through all available addresses, or through any subset of the available addresses. For example, it may use a one-hot encoded address, where the single address bit that is high sequences through the available address bits.

Implementations support hard-wired, semi-fixed, and programmable modes of the ALU. Where an ALU mode is semi-fixed or programmable, the implementation seizes control of the ALU by replacing an ALU control signal from an ALU controller with a replacement ALU control signal. The replacement ALU control signal may be stored in a register, such as a JTAG test control register. The BIST controller may control a multiplexer and direct it to forward the replacement ALU control signal to the ALU instead of the ALU control signal. An implementation may further clear the state of the ALU prior to applying any test vectors, for example by applying a reset routing, and an implementation may flush the ALU after applying test vectors, for example by applying a series of zero vectors to the datapath.

A Reconfigurable Processor System

Figure 6:
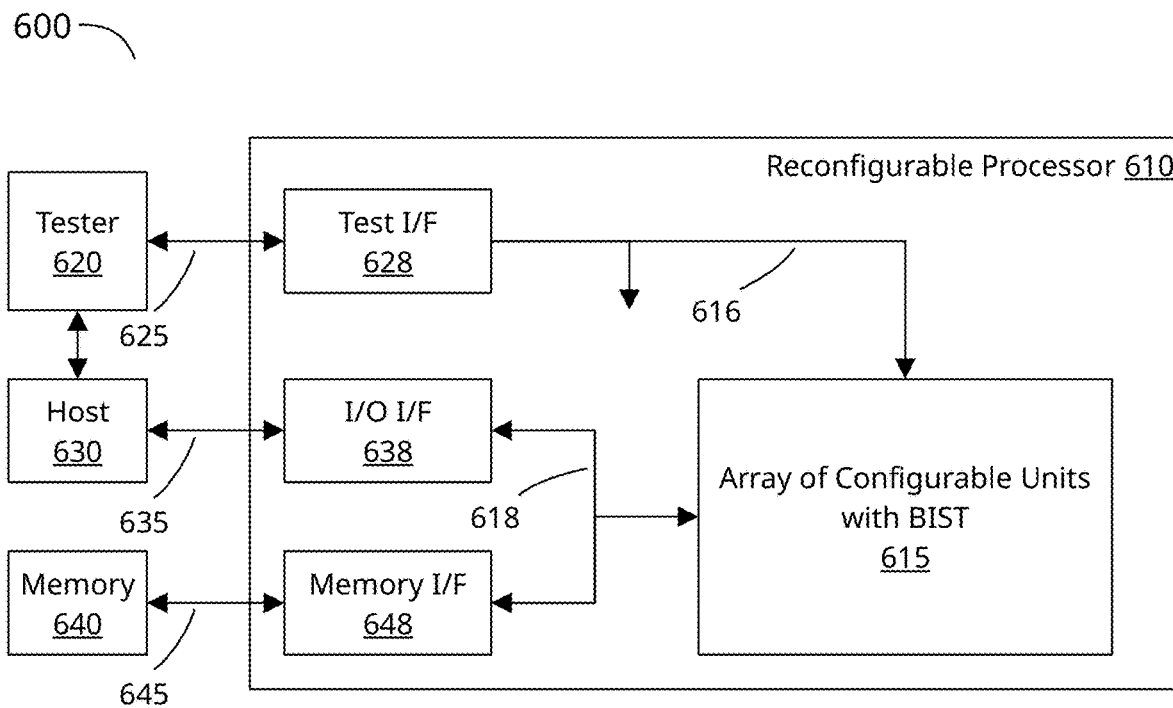
FIG. 6 is a system diagram illustrating a test system including a reconfigurable processor, a tester, a test host, and a memory, in an implementation of the disclosed technology.

FIG. 6 is a system diagram illustrating a test system 600 including a reconfigurable processor 610, a tester 620, a test host 630, and a memory 640, in an implementation of the disclosed technology. As shown in the example of FIG. 6, reconfigurable processor 610, which may be a single semiconductor chip, includes an array of configurable units 615, coupled with a test interface 628, an external I/O interface 638, and an external memory interface 648. Test interface 628 may be coupled with array of configurable units 615 and, optionally, other parts of reconfigurable processor 610 via test bus 616. I/O interface 638 and memory interface 648 may be coupled with array of configurable units 615 via databus 618. Tester 620 is coupled with test interface 628 via lines 625. Test host 630 is coupled with U/O interface 638 via lines 635. Memory 640 is coupled with memory interface 648 via lines 645. Additionally, tester 620 and test host 630 may interface with each other.

Reconfigurable processor 610 may be, or include, a CGRA, whose architecture and functionality will be clarified in successive figures. In any case, array of configurable units 615 includes multiple configurable units, and a configurable unit may include a memory and/or an ALU. For example, a configurable unit may include a PMU, a PCU, or both a PMU and a PCU. A configurable unit further includes a test interface coupled with test bus 616 and dedicated self-test logic as described herein. For example, a configurable unit that includes a memory and an ALU may further include the test circuits shown in and described for FIG. 3. In a reconfigurable processor that separates PMUs and PCUs as individual configurable units, a PMU may hold a first test interface, a first BIST controller, and a datapath multiplexer, similar to multiplexer 372, whereas a PCU may hold a second test interface, a second BIST controller, a test control register, an ALU control multiplexer, and a MISR.

To configure configurable units in array of configurable units 615 with a configuration file, test host 630 can send the configuration file to memory 640 via I/O interface 638, databus 618, and memory interface 648. The configuration file can be loaded in many ways, as suits a particular implementation, including in datapaths outside reconfigurable processor 610. The configuration file can be retrieved from memory 640 via the memory interface 648. Chunks of the configuration file can then be sent in a distribution sequence to configurable units in array of configurable units 615.

Reconfigurable processor 610 and one or more reconfigurable components therewithin (e.g., array of configurable units 615) are referred to as "reconfigurable hardware", as reconfigurable processor 610 and the one or more components therewithin are configurable and reconfigurable to suit needs of a program being executed thereon. Reconfigurable components can be statically configured in a data flow setting during execution of a function using the components.

Figure 7:
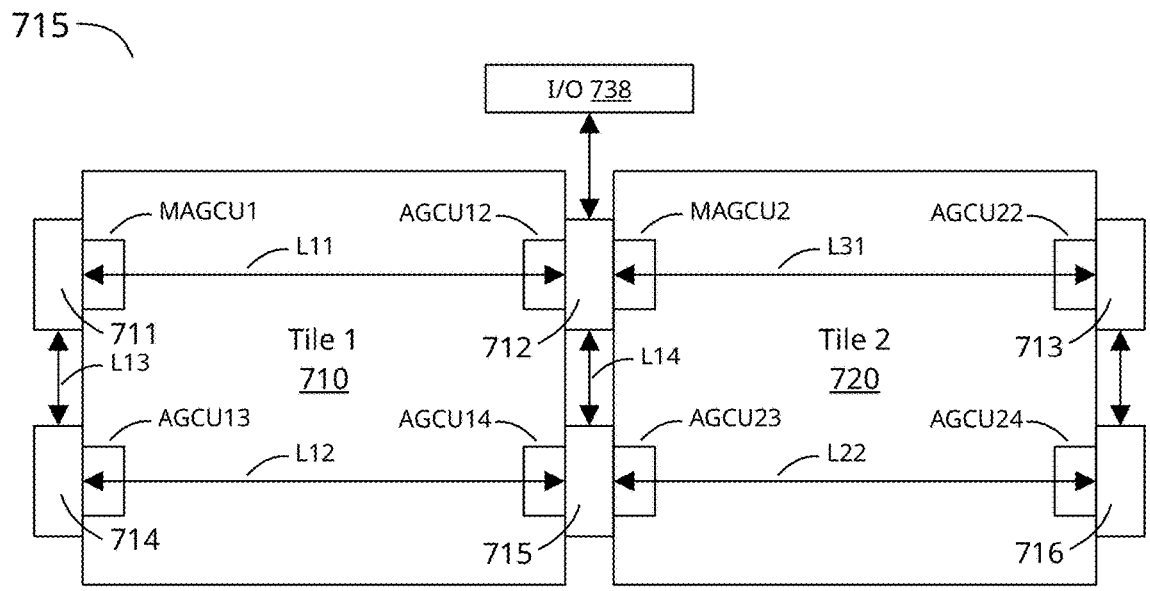
FIG. 7 is a simplified block diagram of components of a CGRA processor.

FIG. 7 is a simplified block diagram of components of a CGRA processor 700. In this example, CGRA processor 700 has 2 tiles (tile 710 and tile 720). A tile comprises an array of configurable units coupled to a bus system, that may include an array-level network. The bus system includes a top-level network coupling the tiles to external I/O interface 738 (or any number of interfaces). Other implementations may use different bus architectures. The configurable units in each tile may be nodes on the array-level network.

Each tile has four AGCUs (e.g., MAGCU1, AGCU12, AGCU13, and AGCU14 in tile 710). The AGCUs are nodes on the top-level network and nodes on the array-level networks, and include resources for routing data among nodes on the top-level network and nodes on the array-level network in each tile.

Nodes on the top level network in this example include one or more external i/O interfaces, including I/O interface 738. The interfaces to external devices include circuits for routing data among nodes on the top-level network and external devices, such as high-capacity memory, host processors, other CGRA processors, FPGA devices, and so on, that are coupled with the interfaces.

One of the AGCUs in a tile in this example is configured to be a master AGCU (MAGCU), which includes an array configuration load/unload controller for the tile. Other implementations may include more than one array configuration load/unload controller, and one array configuration load/unload controller may be implemented by logic distributed among more than one AGCU.

The MAGCU1 includes a configuration load/unload controller for tile 710, and MAGCU2 includes a configuration load/unload controller for tile 720. In other implementations, a configuration load/unload controller can be designed for loading and unloading configuration of more than one tile. In further implementations, more than one configuration controller can be designed for configuration of a single tile. Also, the configuration load/unload controller can be implemented in other portions of the system, including as a stand-alone node on the top-level network and the array-level network or networks.

The top-level network is constructed using top-level switches (switch 711, switch 712, switch 713, switch 714, switch 715, and switch 716) coupled with each other as well as with other nodes on the top-level network, including the AGCUs, and I/O interface 738. The top-level network includes links (e.g., L11, L12, L21, L22) connecting the top-level switches. Data may travel in packets between the top-level switches on the links, and from the switches to the nodes on the network coupled with the switches. For example, switch 711 and switch 712 are coupled by a link L11, switch 714 and switch 715 are coupled by a link L12, switch 711 and switch 714 are coupled by a link L13, and switch 712 and switch 713 are coupled by a link L21. The links can include one or more buses and supporting control lines, including for example a chunk-wide bus (vector bus). For example, the top-level network can include data, request and response channels operable in coordination for transfer of data in a manner analogous to an AXI compatible protocol. See, AMBA® AXI and ACE Protocol Specification, ARM, 2017.

Top-level switches can be coupled with AGCUs. For example, switch 711, switch 712, switch 714 and switch 715 are coupled with MAGCU1, AGCU12, AGCU13 and AGCU14 in tile 710, respectively. Switch 712, switch 713, switch 715 and switch 716 are coupled with MAGCU2, AGCU22, AGCU23 and AGCU24 in tile 720, respectively. Top-level switches can be coupled with one or more external I/O interfaces (e.g., I/O interface 738).

Figure 8A:
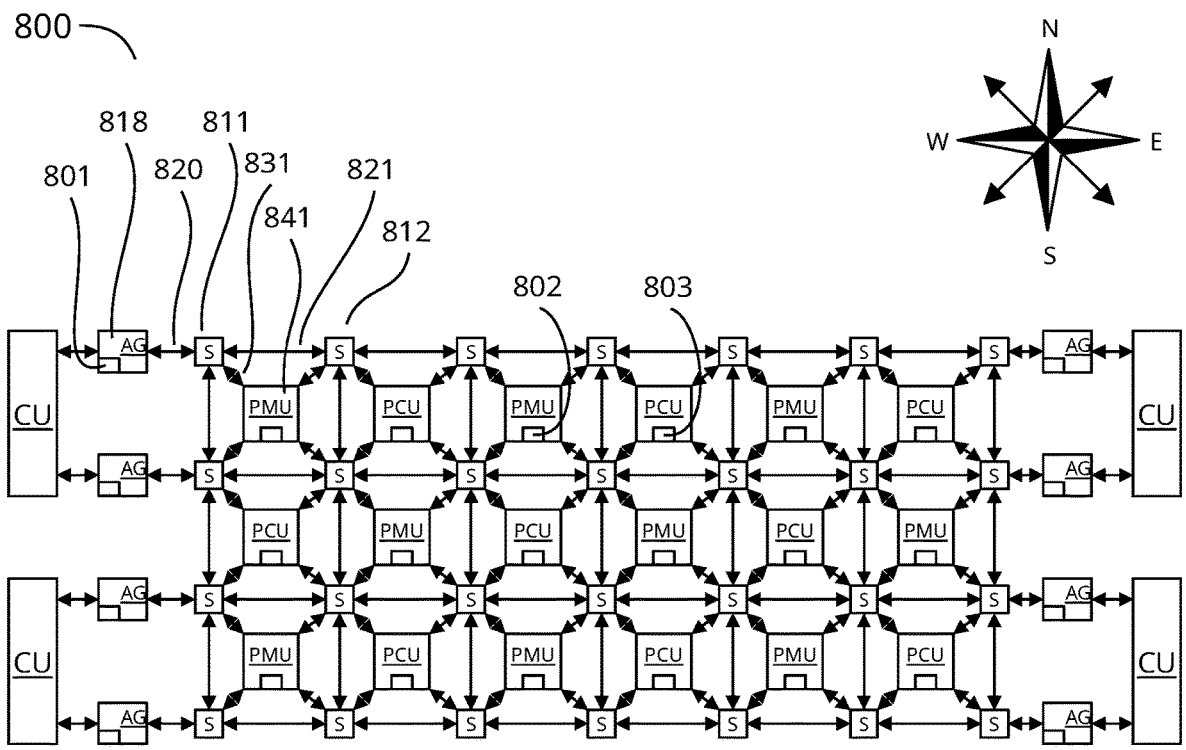
FIG. 8A is a simplified diagram of a tile comprising an array of configurable units in an implementation of the disclosed technology.

FIG. 8A is a simplified diagram of a tile comprising an array of configurable units 800 in an implementation of the disclosed technology. In this example, array of configurable units 800 includes multiple types of configurable units. The types of configurable units, in this example, include PMU, PCU, switch units (S), and AGCUs (each including two address generators AG and a shared CU). For an example of the functions of these types of configurable units, see Prabhakar et al., "Plasticine: A Reconfigurable Architecture for Parallel Patterns", as detailed in the section Cross References. Each of the configurable units may include a configuration store comprising a set of registers or flip-flops storing configuration data that represents either the setup or the sequence to run a program, and that can include the number of nested loops, the limits of each loop iterator, the instructions to be executed for each stage, the source of the operands, and the network parameters for the input and output interfaces. In the implementation of array of configurable units 800, PMU and PCU units are arranged in a checkerboard pattern.

Additionally, each of these configurable units contains a configuration store comprising a set of registers or flip-flops that store a status usable to track progress in nested loops or otherwise. A configuration file includes a bitstream representing the initial configuration, or starting state, of each of the components that execute the program. This bitstream is referred to as a bit file. Program Load is the process of setting up the configuration stores in the array of configurable units based on the contents of the bit file to allow all the components to execute a program (i.e., a machine). Program Load may also require loading all PMU memories.

The bus system includes links interconnecting configurable units in the array. The links in the array level network include one or more, and in this case two, kinds of physical data buses: a chunk-level vector bus (e.g., 512 bits of data), and a word-level scalar bus (e.g., 32 bits of data). For instance, interconnect 821 between switch 811 and switch 812 may include a vector bus interconnect with vector bus width of 512 bits, and a scalar bus interconnect with a scalar bus width of 32 bits. Also, a control bus (see FIGS. 9-11) that can comprise a configurable interconnect is included carrying multiple control bits on signal routes designated by configuration bits in the configuration file for the tile. The control bus can comprise physical lines separate from the data buses in some implementations. In other implementations, the control bus can be implemented using the same physical lines with a separate protocol or in a time sharing procedure.

The physical buses differ in the granularity of data being transferred. In one implementation, the vector bus can carry a chunk that includes 16 channels (e.g., 512 bits) of data as its payload. The scalar bus can have a 32-bit payload and carry scalar operands or control information. The control bus can carry control handshakes such as tokens and other signals. The vector and scalar buses can be packet-switched, including headers that indicate a destination of each packet and other information such as sequence numbers that can be used to reassemble a file when the packets are received out of order. Each packet header can contain a destination identifier that identifies the geographical coordinates of the destination switch unit (e.g., the row and column in the array), and an interface identifier that identifies the interface on the destination switch (e.g., North, South, East, West, etc.) used to reach the destination unit.

A switch unit, as shown in the example of FIG. 8A, may have eight interfaces. The North, South, East and West interfaces of a switch unit are used for connections between switch units. The Northeast, Southeast, Northwest and Southwest interfaces of a switch unit are each used to make connections with PCU or PMU instances. Two switch units in each tile quadrant have connections to an AGCU that include multiple address generation (AG) units and a coalescing unit (CU) coupled with the multiple address generation units. The coalescing unit (CU) arbitrates between the AGs and processes memory requests. Each of the eight interfaces of a switch unit can include a vector interface, a scalar interface, and a control interface to communicate with the vector network, the scalar network, and the control network.

During execution of an execution fragment of a machine after configuration, data can be sent via one or more unit switches and one or more links between the unit switches to the configurable units using the vector bus and vector interface(s) of the one or more switch units on the array level network.

A data processing operation implemented by configuration of a tile comprises a plurality of execution fragments of the data processing operation which are distributed among and executed by corresponding configurable units (AGs, CUs. PMUs, and PCUs in this example).

Test circuits in this example comprises configurable units with dedicated BIST circuitry that can be addressed via a test bus such as test bus 616 in FIG. 6. In this example, the BIST circuitry includes BIST logic 801 in AG 818, BIST logic 802 in a PMU, BIST logic 803 in a PCU, and BIST logic in a switch, as described above. In the illustrated embodiment all configurable units (PMUs, PCUs, AGs) in the array may include local dedicated BIST circuitry. In some embodiments, a plurality of the configurable units in the array, which can be fewer than all the configurable units in the array, include local dedicated BIST circuitry. By including separately addressable (via the test bus) BIST controllers for each configurable unit in a plurality of configurable units in the array, an implementation significantly reduces full-chip debug time at a preproduction stage by indicating where a defect is related. While operational in the field, the information makes it possible to mitigate the results of a defect, for example by replacing a configurable unit, shutting it down, slowing it down, speeding it up, or any other action that keeps array of configurable units 800 functioning acceptably.

In one implementation, the configurable units include configuration and status registers holding unit configuration files loaded in a configuration load process or unloaded in a configuration unload process. The registers can be connected in a serial chain and can be loaded with configuration data through a process of shifting bits through the serial chain. In some implementations, there may be more than one serial chain arranged in parallel or in series. When a configurable unit receives the, for example, 512 bits of configuration data in one bus cycle, the configurable unit shifts this data through its serial chain at the rate of 1 bit per cycle, where shifter cycles can run at the same rate as the bus cycle. It will take 512 shifter cycles for a configurable unit to load 512 configuration bits with the 512 bits of data received over the vector interface.

A configuration file or bit file, before configuration of the tile, can be sent using the same vector bus, via one or more unit switches and one or more links between the unit switches to the configurable unit using the vector bus and vector interface(s) of the one or more switch units on the array level network. For instance, a chunk of configuration data in a unit file particular to a configurable unit PMU 841 can be sent to the PMU 841, via a link 820 between a load controller in the address generator AG and the West (W) vector interface of switch 811, switch 811, and a link 831 between the Southeast (SE) vector interface of switch 811 and PMU 841. Configuration data for the instrumentation network can be included in the configuration data for associated configurable units or provided via other configuration data structures.

The configurable units interface with the memory through multiple memory interfaces. Each of the memory interfaces can be accessed using several AGCUs. Each AGCU contains a reconfigurable scalar data path to generate requests for the off-chip memory. Each AGCU contains FIFOs (first-in-first-out buffers for organizing data) to buffer outgoing commands, data, and incoming responses from the off-chip memory.

Configuration files can be loaded to specify the configuration of the tile including instrumentation logic units and the control bus, for the purposes of particular data processing operations, including execution fragments in the configurable units, interconnect configurations and instrumentation network configurations. Technology for coordinating the loading and unloading of configuration files is described by Shah et al. in "Configuration Load of a Reconfigurable Data Processor", U.S. Pat. No. 10,831,507, issued Nov. 10, 2020.

Figure 8B:
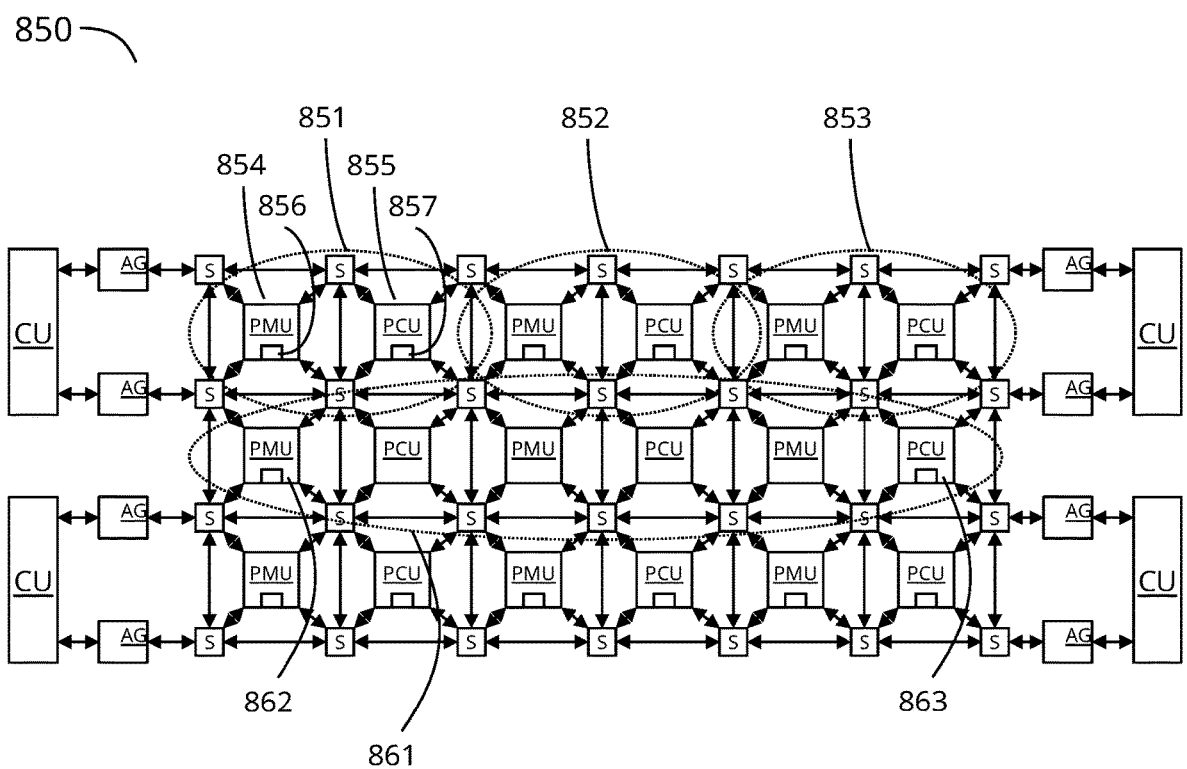
FIG. 8B is another example diagram of a tile comprising an array of configurable units in an implementation of the disclosed technology.

FIG. 8B is another example diagram of a tile comprising an array of configurable units 850 in an implementation of the disclosed technology. Unlike in array of configurable units 800, PMU and PCU units are not arranged in a checkerboard pattern. Instead, they are arranged in identical rows with alternating PMU and PCU units. More generally, they are arranged in subarrays such as partial or whole rows, partial or whole columns, or other subarrays spanning one or more rows and one or more columns. Subarrays may be homogenous comprising identical circuitry in the sense that each homogeneous subarray could be replaced by another homogeneous subarray. In such a case, a spare homogeneous subarray can be used to replace a defective homogeneous subarray identified by the BIST, see for example U.S. patent application Ser. No. 17/378,399 by Grohoski et al., which is incorporated by reference for all purposes as if fully set forth herein. But in some embodiments, subarrays are not necessarily homogeneous. For example, in its first row, array of configurable units 850 includes subarray 851, subarray 852, and subarray 853. Each of these comprises one PMU and one PCU. For example subarray 851 includes PMU 854 and PCU 855. PMU 854 may include a first set of BIST circuits 856, as will later be illustrated with reference to FIG. 9. PCU 855 may include a second set of BIST circuits 857, as will be illustrated with reference to FIG. 10. Jointly, first set of BIST circuits 856 and second set of BIST circuits 857 provide all test functionality illustrated earlier with reference to FIGS. 3-4. In its second row, array of configurable units 850 includes subarray 861, with a total of three PMU units and three PCU units. The first PMU 862 includes a first set of BIST circuits, and the last PCU 863 includes a second set of BIST circuits. Again, jointly, the first set of BIST circuits and the second set of BIST circuits provide all test functionality illustrated earlier with reference to FIGS. 3-4. However, the datapath in last PCU 863 is much longer than in, for instance, subarray 851.

Array of configurable units 850 comprises in this example of rows and columns of processors, each of which is a configurable unit. In another example, the array can comprise multiple stacked planes, each plane including rows and columns. The array of configurable units may include N homogeneous sub-arrays, arranged in N identical rows. Also, array of configurable units 850 includes N+1 rows of switch units S that form the routing infrastructure of the array level network. In other embodiments, the subarray can be columns. In yet other embodiments, other spare geometries, such as rectangles consisting of a contiguous subset of rows and columns of PMUs and PC Us, may be utilized.

Although FIGS. 8A-B show arrays of configurable units, more generally the units don't need to be configurable. An array of processor units may be integrated on a single integrated circuit chip. A processor may include one or more local memories and one or more ALUs. An ALU may include a SIMD. An array may consist of subarrays, each comprising one or more processor units, and a set of BIST circuits as described with reference to FIGS. 3-4 to test a datapath in the subarray. The datapath may span one or more processor units. The BIST circuits may include a test controller or BIST controller, an input multiplexer to override input data with test vectors generated by the test controller, a test control register and multiplexer to override a processor control setting or ALU control setting stored in a functional configuration register with a replacement control setting stored in the test control register, and a MISR or more generally, a data compressor and a signature register, with a test result output that can be read from outside the subarray. Test vectors generated by the test controller may include memory test patterns and/or pseudo-random data. An array of processor units comprises two or more subarrays with each one or more processor units and one set of test circuits, such that each of the subarrays is individually testable with the methods presented herein.

Figure 9:
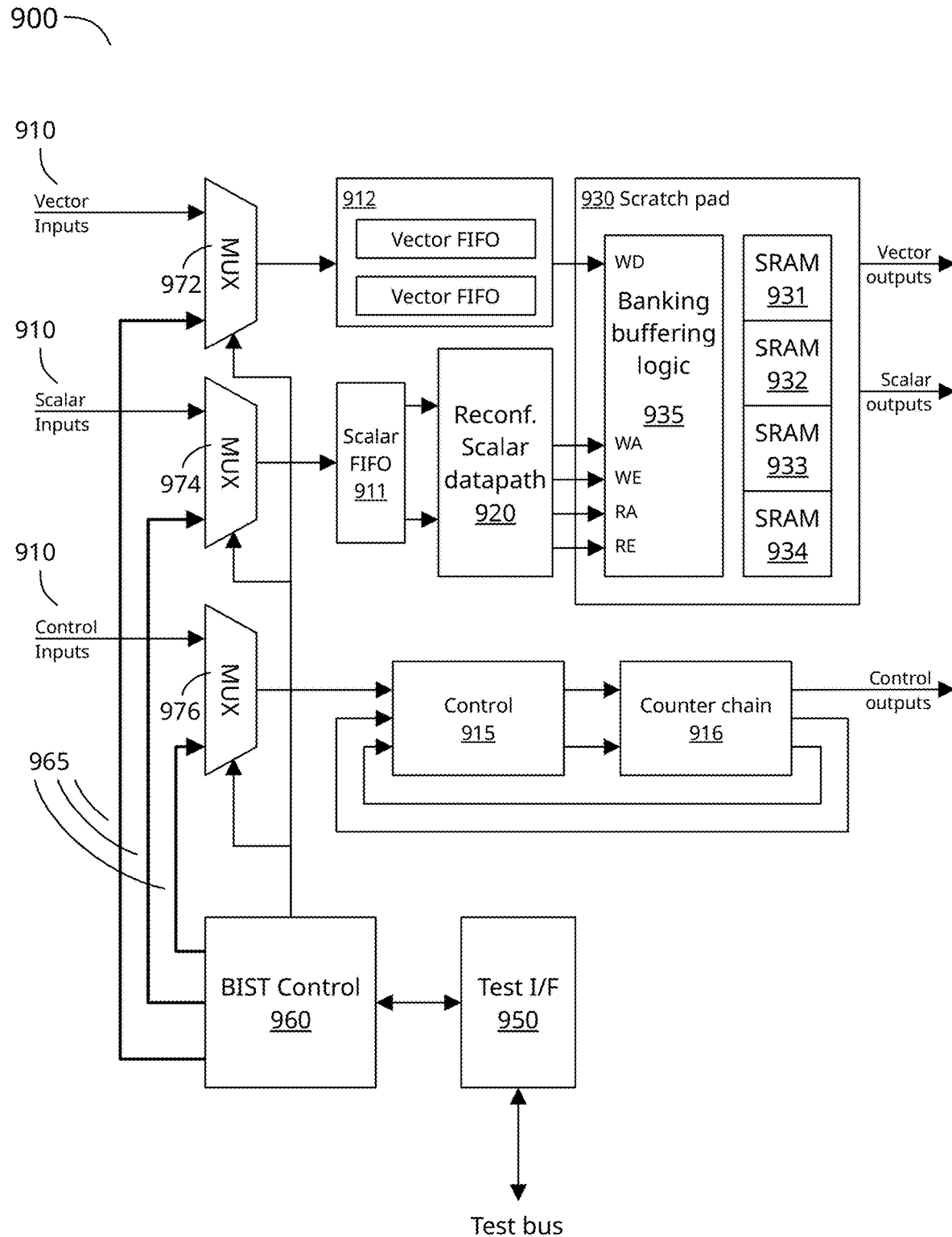
FIG. 9 is a block diagram illustrating an example configurable Pattern Memory Unit (PMU) including BIST circuits.

FIG. 9 is a block diagram illustrating an example configurable PMU 900 including BIST circuits. Configurable PMU 900 may include scratchpad memory 930 coupled with a reconfigurable scalar datapath 920 configured to calculate addresses (RA, WA) and control (WE, RE) of scratchpad memory 930, along with bus interfaces also used in a PCU (FIG. 10), including for vectors, scalars, and control information. Configurable PMU 900 is a configurable unit that includes an input databus 910 (for example, with vector inputs, scalar inputs, and control inputs). It also includes a replacement databus 965 for testing in an implementation of the disclosed technology. Configurable PMU 900 includes the following BIST circuits: test interface 950, which may be a JTAG port, first BIST controller 960 (first is used because it may operate in tandem with a second BIST controller used in a PCU), multiplexer 972, multiplexer 974, and multiplexer 976. First BIST controller 960 may be started by control signals from the test bus via test interface 950. When started, first BIST controller 960 takes control of the input data of configurable PMU 900 by deselecting the input databus 910 in multiplexer 972, multiplexer 974, and multiplexer 976, respectively, and selecting replacement databus 965 instead. Then, first BIST controller 960 generates test signals, which may include a series of test patterns targeted at testing memory functionality, for example for memory 931 through memory 934, and pseudo-random numbers focused on testing logic, as disclosed earlier in this document. First BIST controller 960 places the test signals on replacement databus 965.

The input databus 910 may include scalar inputs, and vector inputs, usable to provide write data (WD). An output databus may provide scalar outputs and vector outputs to other configurable units, for example to a PCU. The datapath may be organized as a multi-stage reconfigurable pipeline, including stages of functional units (FUs) and associated pipeline registers (PRs) that register inputs and outputs of the functional units. PMUs can be used to store distributed on-chip memory throughout the array of reconfigurable units.

Scratchpad memory 930 may include multiple memory banks (e.g., memory 931 through memory 934, which may be or include SRAMs). The banking and buffering logic 935 for the memory banks in the scratchpad can be configured to operate in several banking modes to support various access patterns. A computation unit as described herein can include a lookup table stored in scratchpad memory 930, from a configuration file or from other sources. In a computation unit as described herein, reconfigurable scalar datapath 920 can translate a section of a raw input value I for addressing lookup tables implementing a function f(I), into the addressing format utilized by the scratchpad memory 930, adding appropriate offsets and so on, to read the entries of the lookup table stored in scratchpad memory 930 using the sections of the input value I. Each PMU can include write address calculation logic and read address calculation logic that provide write address WA, write enable WE, read address RA and read enable RE to banking and buffering logic 935. Based on the state of scalar FIFO 911 and vector FIFOs 912, and external control inputs, control block 915 can be configured to trigger the write address computation, read address computation, or both, by enabling the appropriate counters 916. A programmable chain of counters 916 (Control Inputs, Control Outputs) and control block 915 can trigger PMU execution.

When testing, first BIST controller 960 starts by selecting replacement databus 965 at the input data multiplexers (multiplexer 972, multiplexer 974, and multiplexer 976). Thus, it overrides any data that may be available on input databus 910. First BIST controller 960 determines a memory address and provides the memory address to banking and buffering logic 935 (at input WA) via replacement databus 965, multiplexer 974, scalar FIFO 911, and reconfigurable scalar datapath 920. It generates a test vector, which may include a memory test and/or a pseudo-random data, and provides the test vector to scratchpad memory 930 (WD input) via replacement databus 965, multiplexer 972, and vector FIFOs 912. In a first cycle, it writes the test vector to banking and buffering logic 935 at the memory address by asserting the WE input at banking and buffering logic 935 via replacement databus 965, multiplexer 974, scalar FIFO 911, and reconfigurable scalar datapath 920. In a second cycle, later than the first cycle, first BIST controller 960 controls a memory read operation from the memory address by providing the memory address to the RA input at banking and buffering logic 935 via replacement databus 965, multiplexer 974, scalar FIFO 911, and reconfigurable scalar datapath 920, and asserting the RE input at banking and buffering logic 935 via replacement databus 965, multiplexer 974, scalar FIFO 911, and reconfigurable scalar datapath 920. Scratchpad memory 930 releases the data stored at the memory address to the output databus. Of course, if the datapath including scratchpad memory 930 and all operational units coupled to it function correctly, the data stored at the memory address matches the test vector.

Figure 10:
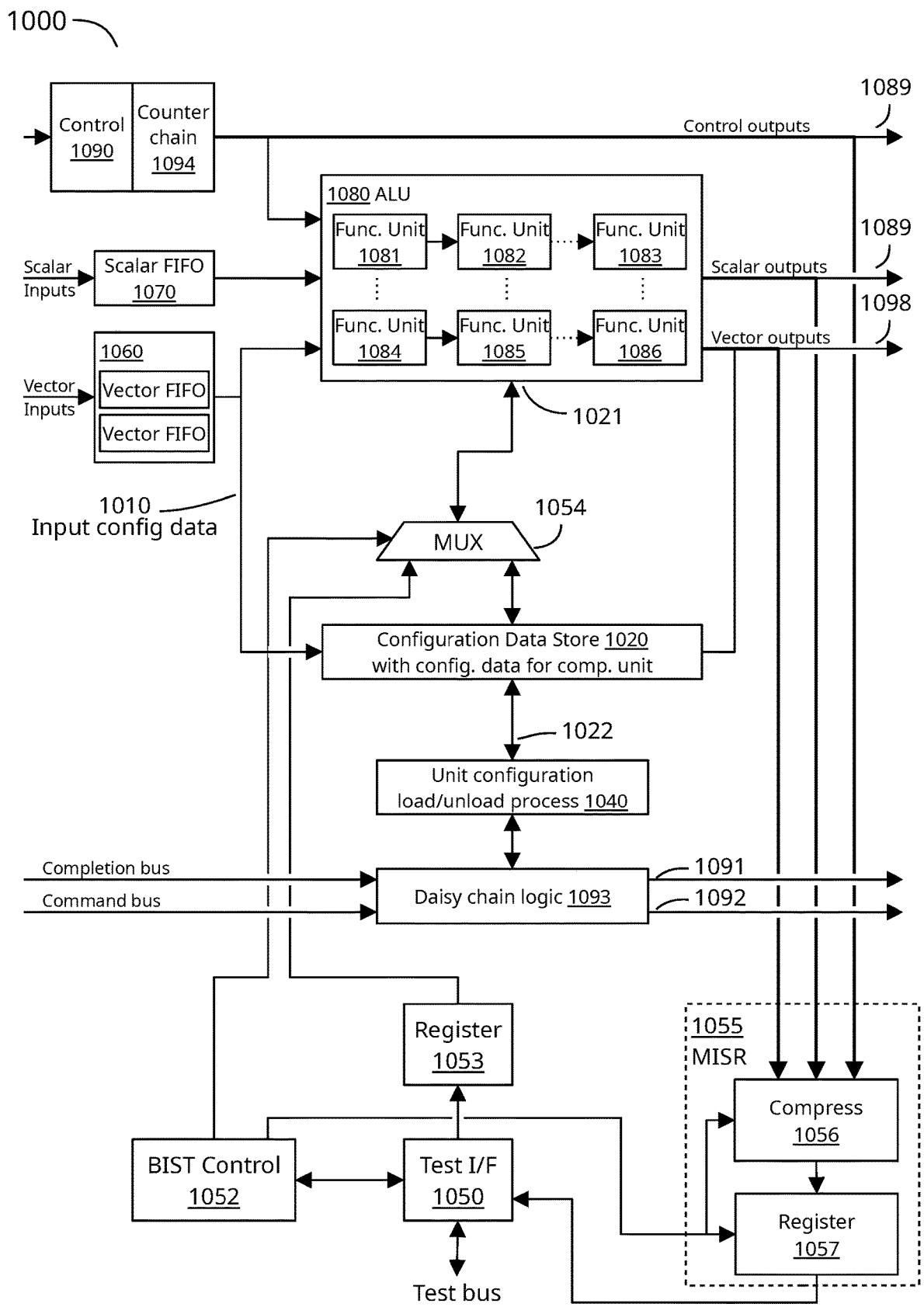
FIG. 10 is a block diagram illustrating an example configurable Pattern Compute Unit (PCU) including BIST circuits.

FIG. 10 is a block diagram illustrating an example configurable PCU 1000 including BIST circuits. Configurable PCU 1000 is a configurable unit that can interface with the scalar, vector, and control buses also used in configurable PMU 900, in this example using three corresponding sets of inputs and outputs (I/O): scalar I/O, vector I/O, and control I/O. Scalar I/Os can be used to communicate single words of data (e.g., 128 bits). Vector IOs can be used to communicate chunks of data (e.g., 512 bits), in cases such as receiving configuration data in a unit configuration load process and transmitting and receiving data during operation after configuration across a long pipeline between multiple PCUs. Control I/Os can be used to communicate signals on control lines such as the start or end of execution of a configurable unit. Control inputs are received by control block 1090, and control outputs are provided by the control block 1090. An output databus 1089 may comprise the scalar outputs, vector outputs, and control outputs.

Each vector input is buffered in this example using a vector FIFO in a vector FIFO block 1060 which can include one or more vector FIFOs. Likewise, in this example, each scalar input is buffered using a scalar FIFO 1070. Using input FIFOs decouples timing between data producers and consumers and simplifies inter-configurable-unit control logic by making it robust to input delay mismatches.

The configurable unit includes ALU 1080, which may include a SIMD to support multiple reconfigurable data channels. The SIMD may have a multiple-stage (stage 1 . . . stage N), reconfigurable pipeline. Chunks of data written into a configuration serial chain in the configurable unit include configuration data for each stage of each data channel in the SIMD. The configuration serial chain in the configuration data store 1020 is coupled with the multiple data channels in ALU 1080 via ALU control input 1021.

A configurable data channel organized as a multi-stage pipeline can include multiple functional units (e.g., functional unit 1081 through functional unit 1086) at respective stages. A computation unit or parts of a computation unit can be implemented in multiple functional units at respective stages in a multi-stage pipeline or in multiple multi-stage pipelines. In the example as shown in FIG. 10, a circuit can be implemented in multiple functional units and multiple memory units. Input registers in functional units can register inputs from scalar FIFO 1070 or vector FIFO block 1060 or from previous stages in a multi-stage pipeline. A functional unit at a stage in a multi-stage pipeline can execute a function, e.g., logical shift, an arithmetic function, comparison, a logical operation, etc., and generate an output.

A configurable unit in the array of configurable units includes configuration data store 1020 (e.g., serial chains) to store unit files comprising a plurality of chunks (or sub-files of other sizes) of configuration data particular to the corresponding configurable units. Configurable units in the array of configurable units each include unit configuration load logic 1040 coupled with configuration data store 1020 via line 1022, to execute a unit configuration load process. The unit configuration load process includes receiving, via the bus system (e.g., the vector inputs), chunks of a unit file particular to the configurable unit and loading the received chunks into configuration data store 1020 of the configurable unit. The unit file loaded into configuration data store 1020 can include configuration data, including opcodes and routing configuration, for circuits (e.g., module) implementing the instrumentation logic in multiple functional units and multiple memory units, as described herein.

The configuration data stores in configurable units in the two or more configurable units in this example comprise serial chains of latches, where the latches store bits that control configuration of the resources in the configurable unit. A serial chain in a configuration data store can include a shift register chain for configuration data and a second shift register chain for state information and counter values connected in series.

The input configuration data 1010 can be provided to a vector FIFO as vector inputs, and then be transferred to configuration data store 1020. The output configuration data 1030 can be unloaded from configuration data store 1020 using the vector outputs.

The CGRA uses a daisy-chained completion bus to indicate when a load/unload command has been completed. The master AGCU transmits the program load and unload commands to configurable units in the array of configurable units over a daisy-chained command bus. As shown in the example of FIG. 10, a control block 1090, a daisy-chained completion bus 1091 and a daisy-chained command bus 1092 are coupled to daisy-chain logic 1093, which communicates with the unit configuration load logic 1040. Daisy-chain logic 1093 can include load complete status logic, as described below. The daisy-chained completion bus is further described below. Other topologies for the command and completion buses are clearly possible but not described here.

Configurable PCU 1000 includes the following BIST circuits: test interface 1050, which may be a JTAG port, second BIST controller 1052 (second is used as it may operate in tandem with first BIST controller 960 used in a PMU), test control register 1053, ALU control multiplexer 1054, and MISR 1055, which may include, separate or combined, test result compressor 1056 and signature register 1057. Second BIST controller 1052 may be started by control signals from the test bus via test interface 1050. When started, second BIST controller 1052 takes control of the configuration data by overriding data from configuration data store 1020 with test configuration data previously stored in test control register 1053. ALU control multiplexer 1054, controlled by second BIST controller 1052, selects replacement configuration data from test control register 1053 rather than the configuration data from configuration data store 1020. Second BIST controller 1052 also controls MISR 1055, ensuring that data from output databus 1089 is compressed as disclosed earlier in this document, and that the compressed data is stored in signature register 1057, from where it can be read by an external tester via test interface 1050.

This is one simplified example of a configuration of a configurable processor for implementing a computation unit as described herein. The configurable processor can be configured in other ways to implement a computation unit. Other types of configurable processors can implement the computation unit in other ways. Also, the computation unit can be implemented using dedicated logic in some examples, or a combination of dedicated logic and instruction-controlled processors.

Considerations

We describe various implementations of a processor unit that includes BIST, and methods therefor.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the following implementations.

Although the description has been described with respect to particular implementations thereof, these particular implementations are merely illustrative, and not restrictive. The description may reference specific structural implementations and methods, and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. For instance, many of the operations can be implemented in a CGRA, a System-on-Chip (SoC), application-specific integrated circuit (ASIC), programmable processor, or in a programmable logic device such as a field-programmable gate array (FPGA), obviating a need for at least part of the dedicated hardware. Implementations may be as a single chip, or as a multi-chip module (MCM) packaging multiple semiconductor dies in a single package. All such variations and modifications are to be considered within the ambit of the present disclosed technology the nature of which is to be determined from the foregoing description.

Any suitable technology for manufacturing electronic devices can be used to implement the circuits of particular implementations, including CMOS, FinFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular implementations. In some particular implementations, multiple elements, devices, or circuits shown as sequential in this specification can be operating in parallel.

Any suitable programming language can be used to implement the routines of particular implementations including C, C++, Java, JavaScript, compiled languages, interpreted languages and scripts, assembly language, machine language, etc. Different programming techniques can be employed such as procedural or object oriented. Methods embodied in routines can execute on a single processor device or on a multiple processor system. Although the steps, operations, or computations may be presented in a specific order, this order may be changed in different particular implementations. In some particular implementations, multiple steps shown as sequential in this specification can be performed at the same time.

Particular implementations may be implemented in a tangible, non-transitory computer-readable storage medium for use by or in connection with the instruction execution system, apparatus, board, or device. Particular implementations can be implemented in the form of control logic in software or hardware or a combination of both. The control logic, when executed by one or more processors, may be operable to perform that which is described in particular implementations. For example, a tangible non-transitory medium such as a hardware storage device can be used to store the control logic, which can include executable instructions.

Particular implementations may be implemented by using a programmed general-purpose digital computer, application-specific integrated circuits, programmable logic devices, field-programmable gate arrays, optical, chemical, biological, quantum or nanoengineered systems, etc. Other components and mechanisms may be used. In general, the functions of particular implementations can be achieved by any means as is known in the art. Distributed, networked systems, components, and/or circuits can be used. Cloud computing or cloud services can be employed. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit.

We claim:

1. A processor unit comprising, a memory, a logic unit coupled with a read data output of the memory, a logic unit control circuit with a control output coupled with a control input of the logic unit, a test controller, a test control register, and a signature register with an input coupled with a logic unit output, wherein the test controller is configured to manage a series of steps comprising:

replacing a logic unit control signal with a replacement logic unit control signal obtained from the test control register;
generating a test pattern;
forwarding the test pattern to an input of a first circuit, wherein the input of the first circuit is not a scan chain input;
forwarding first circuit output data from an output of the first circuit to the logic unit;
executing a logic unit operation on the first circuit output data based on the replacement logic unit control signal;
obtaining a test result from a logic unit output;
compressing the test result to obtain a signature; and
storing the signature in the signature register.

2. The processor unit of claim 1, wherein:
the first circuit includes the memory;
forwarding the test pattern to the input of the first circuit includes writing the test pattern at a first address in the memory; and
obtaining first circuit output data from the output of the first circuit includes reading the output data from the first address in the memory.

3. The processor unit of claim 2, wherein the test pattern is comprised in a series of test patterns for detecting a memory error.

4. The processor unit of claim 3, wherein the series of test patterns for detecting a memory error is based on a march algorithm.

5. The processor unit of claim 3, wherein the series of test patterns for detecting a memory error is based on one or more of a RAM sequential algorithm, a zero-one algorithm, a checkerboard algorithm, a butterfly algorithm, a sliding diagonal algorithm.

6. The processor unit of claim 1, wherein the test pattern is comprised in a series of test patterns that include pseudo-random numbers generated in a first linear-feedback shift register (LFSR) with a first length, a first feedback polynomial, and a first seed value, and wherein the test controller includes the first LFSR.

7. The processor unit of claim 6, wherein the first circuit includes a logic circuit.

8. The processor unit of claim 6, wherein:
the first circuit includes the memory;
forwarding the test pattern to the input of the first circuit includes writing the test pattern at a first address in the memory;
obtaining output data from the output of the first circuit includes reading the output data from the first address in the memory; and
the first address is determined based on an index of the test pattern in the series of test patterns.

9. The processor unit of claim 8, wherein the first address includes a one-hot address based on at least a part of bits included in the index of the test pattern in the series of test patterns.

10. The processor unit of claim 1, wherein the logic unit comprises an arithmetic logic unit (ALU) and the logic unit control circuit comprises an ALU control circuit.

11. The processor unit of claim 10, wherein a datapath includes multiple lanes of parallel data and the ALU includes a SIMD.

12. The processor unit of claim 10, wherein the test controller replaces the logic unit control signal with the replacement logic unit control signal by selecting the replacement logic unit control signal in a multiplexer with an output coupled with the logic unit control input, and with a first input coupled with the ALU control circuit control output, and a second input coupled with the test control register.

13. The processor unit of claim 10, wherein the ALU comprises the test control register, and the test controller replaces the logic unit control signal with the replacement logic unit control signal by sending a signal to the ALU.

14. The processor unit of claim 10, wherein the ALU control circuit comprises the test control register, and the test controller replaces the logic unit control signal with the replacement logic unit control signal by sending a signal to the ALU control circuit.

15. The processor unit of claim 1, wherein the signature register comprises separate circuits for a test result compressor and a signature register.

16. The processor unit of claim 1, wherein the signature register comprises a combined circuit for test result compression and storing the signature.

17. A method to test a datapath in a processor unit, the datapath comprising a memory with a data input and a data output, a logic unit with a control input, a data input and a data output, and an intermediate bus coupling the memory data output with the logic unit data input, the method comprising:
providing a first memory test vector from a series of memory test vectors to the memory data input;
writing the first memory test vector to a first address in the memory;
reading memory output data from the first address in the memory;
forwarding the memory output data via the intermediate bus to the logic unit;
replacing a signal on the control input with a replacement logic unit control signal;
performing a logic unit operation based on the replacement logic unit control signal;
obtaining a test result from the logic unit data output;
compressing the test result to obtain a signature; and
storing the signature in a register.

18. The method of claim 17, wherein the logic unit comprises an arithmetic logic unit (ALU).

19. The method of claim 17, further comprising:
providing a first pseudo-random number from a series of pseudo-random numbers to the memory data input;
writing the first pseudo-random number to a second address in the memory; and
reading memory output data from the second address in the memory.

20. The method of claim 19, wherein the second address is determined based on an index of the first pseudo-random number in the series of pseudo-random numbers.

21. The method of claim 20, wherein the second address includes a one-hot encoded address based on at least a part of bits included in the index.

22. The method of claim 17, further comprising comparing the signature with a precompiled signature to determine a test result.

* * * * *